(12) United States Patent
Li

(10) Patent No.: US 9,218,558 B2
(45) Date of Patent: Dec. 22, 2015

(54) HIGH-FREQUENCY FRAGILE RFID ELECTRONIC TAG WITH ANTI-TRANSFER FUNCTION AND PREPARATION METHOD THEREFOR

(71) Applicant: XIAMEN INNOV ELECTRONICS CO., LTD., Xiamen (CN)

(72) Inventor: Wenzhong Li, Xiamen (CN)

(73) Assignee: XIAMEN INNOV ELECTRONICS TECH CO., LTD., Xiamen (CN)

( * ) Notice: Subject to any disclaimer, the term of this patent is extended or adjusted under 35 U.S.C. 154(b) by 0 days.

(21) Appl. No.: 14/344,907

(22) PCT Filed: Mar. 14, 2013

(86) PCT No.: PCT/CN2013/072562
§ 371 (c)(1),
(2) Date: Mar. 14, 2014

(87) PCT Pub. No.: WO2014/023099
PCT Pub. Date: Feb. 13, 2014

(65) Prior Publication Data
US 2015/0248606 A1    Sep. 3, 2015

(30) Foreign Application Priority Data
Aug. 7, 2012    (CN) .......................... 2012 1 0278303

(51) Int. Cl.
G06K 19/00    (2006.01)
G06K 19/073    (2006.01)
G06K 19/07    (2006.01)
H01L 31/12    (2006.01)
H01L 31/18    (2006.01)

(52) U.S. Cl.
CPC ........ G06K 19/0739 (2013.01); G06K 19/0723 (2013.01); H01L 31/12 (2013.01); H01L 31/18 (2013.01)

(58) Field of Classification Search
USPC .......................................... 235/492; 343/702
See application file for complete search history.

(56) References Cited

U.S. PATENT DOCUMENTS

2006/0049995 A1*    3/2006    Imaoka et al. ................ 343/702
2008/0149731 A1*    6/2008    Arai et al. ..................... 235/492

* cited by examiner

*Primary Examiner* — Daniel Hess
(74) *Attorney, Agent, or Firm* — Stein IP, LLC

(57) ABSTRACT

The tag comprises a bearing substrate, a first adhesive layer, a resin film, an etching antenna layer, a chip, a first insulating layer, a conductive circuit layer, a second adhesive layer, and a pattern-bearing layer. The resin film is disposed between the bearing substrate and the etching antenna layer. The etching antenna layer is etched by copper foil or aluminum foil. The conductive circuit layer and the etching antenna layer are combined to construct a compound high-frequency antenna of the fragile RFID electronic tag. The conductive circuit layer fulfills a communication of a jumper wire on the etching antenna layer. The first insulating layer is disposed between the conductive circuit layer and the etching antenna layer. The chip is connected to the etching antenna layer. The etching antenna layer, the conductive circuit layer, the first insulating layer and the chip are combined to construct a core assembly. The pattern-bearing layer is adhered to the other side of the core assembly via the second adhesive layer.

10 Claims, 1 Drawing Sheet

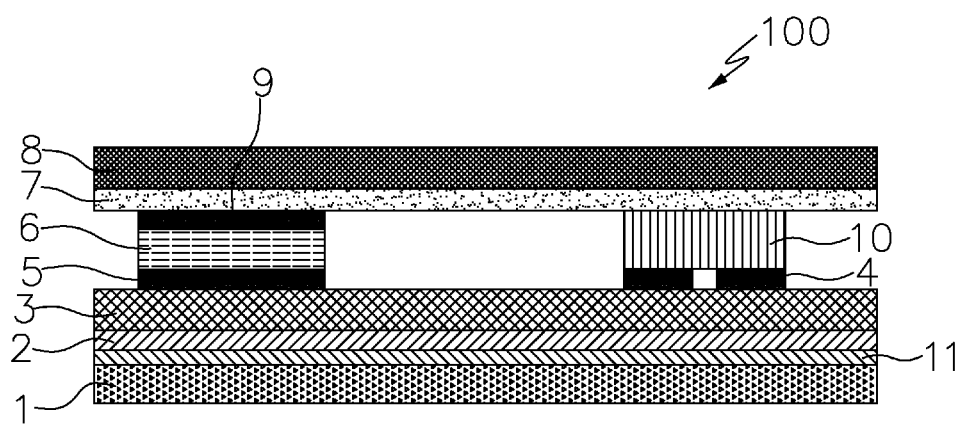
F I G. 1
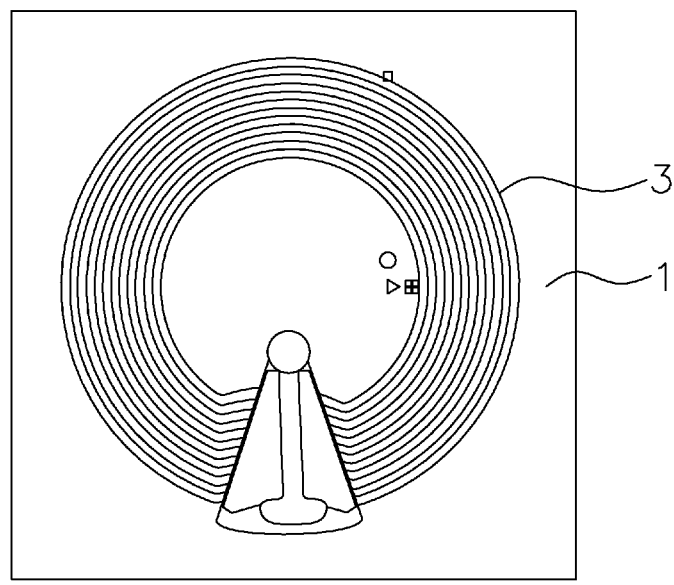
F I G. 2

HIGH-FREQUENCY FRAGILE RFID ELECTRONIC TAG WITH ANTI-TRANSFER FUNCTION AND PREPARATION METHOD THEREFOR

BACKGROUND OF THE INVENTION

1. Field of the Invention

The present invention relates to an RFID field, particularly to a high-frequency fragile RFID electronic tag with anti-transfer function and preparation method therefor adapted to sites requiring an application of RFID to prevent counterfeiting and avoid removing, which serve as a preferable derivation of high-quality products, like vehicle controls, alcohol, medicine, and cosmetics, and serve as a preferable anti-counterfeiting means.

2. Description of the Related Art

General high-frequency fragile electronic tags use fragile silk-screen printing materials or PET as a surface material with a conductive silver paste or conductive ink that is silk-screen printed or intaglio printed on its back surface, which fulfills a non-regular breakage of the material when the fragile tag is attached to a substrate and then stripped. The high-frequency antenna pattern is based on coils in a conventional method of making the tag which provides at least above 0.25 mm in the basic wire spacing and width, at least above 25 mm in the basic tag diameter, and above 0.18 mm in the pin middle space of chip bits. Accordingly, a yield rate of manufacturing chips is low, the variation of resistance values of the whole silver paste circuit is large, and the consistency of the tag property is poor. The complete tags are usually removed after being heated, which cannot attain the fragile function.

The issues on the property safety, food safety, and medical safety are gradually stressed by nations, so the application of fragile RFID electronic tag with high-frequency of 13.56 MH on the derivation and anti-counterfeiting capability becomes more and more important and replaces the general fragile tags in more and more fields. The usual technique adapted to the high-frequency anti-counterfeiting fragile RFID electronic tags are executed by silk-screen printing the conductive ink or metal granules on fragile paper materials and PET substrates to form a printed RFID antenna. In view of the low precision of the printed antenna and the inconsistency of resistances of conductive materials, the conventional art cannot make high-quality RFID tags, and the completed RFID tags cannot suit broad applications.

From above, the inventors submit the subject invention under consideration in light of their abundant researches in the current anti-counterfeiting fragile RFID electronic tags.

SUMMARY OF THE INVENTION

An object of the present invention is to provide a high-frequency fragile RFID electronic tag with anti-transfer function which solves the problem that the poor anti-counterfeiting problem exists when the conventional tags are entirely removed or stripped after being heated.

To obtain the object, the feature of the present invention is described as follows:

The high-frequency fragile RFID electronic tag with anti-transfer function in accordance with the present invention comprises a bearing substrate, a first adhesive layer, a resin film, an etching antenna layer, a conductive circuit layer, a chip, a second adhesive layer, and a pattern-bearing layer. The resin film is disposed between the bearing substrate and the etching antenna layer. The first adhesive layer is disposed between the resin film and the bearing substrate. The etching antenna layer is etched by using copper foil or aluminum foil. The conductive circuit layer and the etching antenna layer are combined to construct a compound high-frequency antenna of the fragile RFID electronic tag. The conductive circuit layer fulfills a communication of a jumper wire on the etching antenna layer. The first insulating layer is disposed between the conductive circuit layer and the etching antenna layer. The chip is connected to the etching antenna layer, whereby the etching antenna layer, the conductive circuit layer, the first insulating layer, and the chip are combined to construct a core assembly. The pattern-bearing layer is adhered to the other side of the entire core assembly by using the second adhesive layer.

Preferably, the fragile RFID electronic tag further includes a second insulating layer disposed between the conductive circuit layer and the second adhesive layer.

Preferably, the fragile RFID electronic tag further includes a conductive adhesive layer disposed between the chip and the second adhesive layer.

Preferably, a material of the pattern-bearing layer can be fragile papers, art papers, or PET films, and an outer surface of the pattern-bearing layer can be silk-screen printed by an ink layer functioning as an anti-counterfeiting mark.

Preferably, a tolerance of an etching precision of circuits on the etching antenna layer is ±0.02 mm, and a minimum wire spacing and width thereof is 0.1-0.25 mm.

A further object of the present invention is to provide a method of forming a high-frequency fragile RFID electronic tag with anti-transfer function comprising steps of:

(1) preparing aluminum foil or copper foil for compounding with a bearing substrate by using a resin film, thereby forming a compound substrate;

(2) forming a photosensitive compound material or silk-screen printing an anti-etching wet film ink on the aluminum foil or the copper foil of the compound substrate;

(3) forming an antenna pattern required to be etched into a Film plate and transferring a circuit pattern of a conducting wire onto the photosensitive compound material or the anti-etching wet film ink by an exposing mode;

(4) developing, etching, and stripping the compound substrate which is exposed and adhered with the photosensitive compound material or the anti-etching wet film ink, thereby forming an etching antenna layer with a tolerance of an etching precision of ±0.02 mm and a minimum wire spacing and width of 0.1-0.25 mm;

(5) silk-screen printing a first insulating layer on the etching antenna layer which is already etched, then silk-screen printing a conductive circuit layer on the first insulating layer, and thence silk-screen printing a second insulating layer on the conductive circuit layer;

(6) combining the etching antenna layer and a chip to form a core assembly; and (7) preparing a pattern-bearing layer, forming an anti-counterfeiting mark layer on one surface of the pattern-bearing layer, coating a second adhesive layer on the other surface thereof, and combining the pattern-bearing layer and the core assembly to obtain the fragile RFID electronic tag.

Preferably, the first insulating layer is an insulating ink with a thickness of 8-30 um, the conductive circuit layer is a conductive silver paste or a conductive ink with a thickness of 5-50 um, and the second insulating layer is an insulating ink with a thickness of 5-30 um.

Preferably, the photosensitive compound material is formed on the aluminum foil or the copper foil by roll-to-roll laminating in the step (2), and the exposing mode in the step (3) is conducted by a roll-to-roll exposure.

Preferably, the resin film is an adhesive film which prevents being softened under a secondary heating temperature at 30-200° C., thereby preventing being completely removed.

Preferably, a step of arranging a conductive adhesive layer on the chip is formed between the step (6) and the step (7).

Accordingly, when the electronic tag of the present invention adhered to flat surfaces of glasses, bottle mouths and desks is then stripped, the stickiness of the second adhesive layer renders the pattern-bearing layer unable to be completed removed. In other words, if the pattern-bearing layer is torn, the pattern-bearing layer affects the conductive circuit layer to interrupt the concatenation between the conductive circuit layer and the etching antenna layer, namely the circuit is destroyed, and data in the chip cannot be read to attain an anti-removal effect. The connection of the jumper wire between the conductive circuit layer and the etching antenna layer cannot be completed removed at the time of using an electric wind to execute a secondary heating process, thereby ensuring the anti-counterfeiting capability of the entire electronic tag. By forming the photosensitive compound material, fulfilling the circuit transfer by exposing, and proceeding with the etching technique, the present invention forms the etching antenna layer above the bearing substrate, the first adhesive layer, and the resin film. The circuit on the etching antenna layer is provided with a tolerance of an etching precision of ±0.02 mm and a minimum wire spacing and width of 0.1-0.25 mm, thereby increasing a complete property of the entire etching electronic tag.

BRIEF DESCRIPTION OF THE DRAWINGS

FIG. 1 is a cross-sectional view showing a high-frequency fragile RFID electronic tag with anti-transfer function of the present invention; and FIG. 2 is a schematic view showing a preferred embodiment of the high-frequency fragile RFID electronic tag with anti-transfer function of the present invention.

DETAILED DESCRIPTION OF THE PREFERRED EMBODIMENTS

The features of the present invention are apparent by reading following descriptions in conjunction with the corresponding drawings.

Referring to FIG. 1 and FIG. 2 shows a high-frequency fragile RFID electronic tag with anti-transfer function 100 in accordance with the present invention comprises a bearing substrate 1, a first adhesive layer 11, a resin film 2, an etching antenna layer 3, a chip 4, a first insulating layer 5, a conductive circuit layer 6, a second adhesive layer 7, and a pattern-bearing layer 8.

The resin film 2 is disposed between the bearing substrate 1 and the etching antenna layer 3 and is preferably an adhesive film which prevents being softened under a secondary heating temperature at 30-200° C., thereby preventing being completely removed. The first adhesive layer 11 is disposed between the resin film 2 and the bearing substrate 1.

The etching antenna layer 3 is etched by using copper foil or aluminum foil. Preferably, a tolerance of an etching precision of circuits on the etching antenna layer 3 is ±0.02 mm, and a minimum wire spacing and width thereof is 0.1-0.25 mm. The conductive circuit layer 6 and the etching antenna layer 3 are combined to construct a compound high-frequency antenna of the fragile RFID electronic tag 100. The conductive circuit layer 6 fulfills a communication of a jumper wire on the etching antenna layer 3. The first insulating layer 5 is disposed between the conductive circuit layer 6 and the etching antenna layer 3. The chip 4 is connected to the etching antenna layer 3, whereby the etching antenna layer 3, the conductive circuit layer 6, the first insulating layer 5, and the chip 4 are combined to construct a core assembly. The pattern-bearing layer 8 is adhered to the other side of the entire core assembly by using the second adhesive layer 7.

More specifically, the fragile RFID electronic tag 100 further includes a second insulating layer 9 disposed between the conductive circuit layer 6 and the second adhesive layer 7. Further, a conductive adhesive layer 10 is disposed between the chip 4 and the second adhesive layer 7. Preferably, the material of the pattern-bearing layer 8 can be fragile papers, art papers, PET films, or other fragile materials. An outer surface of the pattern-bearing layer 8 can be silk-screen printed by an ink layer functioning as an anti-counterfeiting mark. Specifically, patterns adapted to the anti-counterfeiting mark can be barcodes, two-dimensional codes, words, symbols, kinds of trademark figures, or other anti-counterfeiting identification.

Accordingly, when the tag is adhered to flat surfaces of glasses, bottle mouths, and desks, the bearing substrate 1 is replaced by a marked object at the time of using the electronic tag. When the tag is stripped again, the stickiness of the second adhesive layer 7 renders the pattern-bearing layer 8 unable to be completely removed. In other words, if the pattern-bearing layer 8 is torn, the pattern-bearing layer 8 affects the conductive circuit layer 6 to interrupt the concatenation between the conductive circuit layer 6 and the etching antenna layer 3 and break the circuit of the real antenna, whereby the data in the chip 4 cannot be read to attain an anti-removal effect. The connection of the jumper wire between the conductive 5 circuit layer 6 and the etching antenna layer 3 prevents being completely removed when a secondary heating procedure is proceeded by using an electric wind, which ensures the anti-counterfeiting capability of the entire electronic tag.

Concurrently, by forming the photosensitive compound material, using an exposing mode to fulfill the circuit transfer, and proceeding with the etching technique, the etching antenna layer 3, disposed above the bearing substrate 1 and the resin film 2, contains the circuit provided with a tolerance of an etching precision of ±0.02 mm and a minimum wire spacing and width of 0.1-0.25 mm, thereby increasing the whole property of the etching electronic tag.

To disclose the high-frequency fragile RFID electronic tag with anti-transfer function 100 in accordance with the present invention thoroughly, the present invention also provides a method that is respectively described by the following three preferred embodiments:

Embodiment 1

The method comprises steps of:

(1) selecting a PET material with a thickness of 18~60 um. The PET is one of the bearing substrates 1, which is coated with or compound with a chemical adhesive film layer and thereafter compound with aluminum foil with a thickness of 8~50 um, thereby forming a single-sided PET compound aluminum foil. The single-sided PET compound aluminum roil is one of the compound substrates;

(2) roll-to-roll laminating a photosensitive dry material or silk-screen printing an anti-etching wet film ink on the single-sided PET compound aluminum foil;

(3) forming an antenna pattern required to be etched into a film plate and transferring a circuit pattern of a conducting wire onto the photosensitive compound material or the anti-etching wet film ink by a roll-to-roll exposure;

(4) developing, etching, and stripping the compound substrate which is exposed and adhered with the photosensitive compound material or the anti-etching wet film ink, thereby forming an etching antenna layer 3 with a tolerance of an etching precision of ±0.02 mm and a minimum wire spacing and width of 0.1-0.25 mm;

(5) silk-screen printing a first insulating layer 5 on the etching antenna layer 3 which is already etched, then silk-screen printing a conductive circuit layer 6 on the first insulating layer 5, and thence silk-screen printing a second insulating layer 9 on the conductive circuit layer 6; in this preferred embodiment, the first insulating layer 5 is an insulating ink with a thickness of 8-30 um, the conductive circuit layer 6 is a conductive silver paste or a conductive ink with a thickness of 5-50 um, and the second insulating layer 9 is an insulating ink with a thickness of 5-30 um;

(6) combining the etching antenna layer 3 and a chip 4 to form a core assembly, namely INLAY; and (7) preparing a pattern-bearing layer 8 with a thickness of 30-150 um, forming an anti-counterfeiting mark layer, such as printed barcodes, two-dimensional codes, and other figures, on one surface of the pattern-bearing layer, coating a second adhesive layer 7 on the other surface thereof, and combining the pattern-bearing layer and the core assembly to obtain the fragile RFID electronic tag. In the practical manufacture, the aforesaid RFID electronic tag is simply a half-finished product. Before the practical sale, it further includes the steps of stripping the bearing substrate off the resin film 2 and applying a new bearing substrate attached with the first adhesive layer 11, such as release papers or release films, to compound with the resin film 2, whereby the entire RFID electronic tag can be adhered to objects by using the first adhesive layer 11.

Preferably, the resin film 2 can be an adhesive film which prevents being softened under a secondary heating temperature at 30-200° C., thereby preventing being completely removed. Further, a step of arranging a conductive adhesive layer 10 on the chip 4 is formed between the step (6) and the step (7).

Embodiment 2

This preferred embodiment still comprises the same structure as the first preferred embodiment. Differently, the aluminum foil is replaced by the copper foil, and the thickness of the conductive silver paste or the conductive ink is 5-40 um.

Embodiment 3

This preferred embodiment still comprises the same structure as the second preferred embodiment. Differently, the fragile paper with a thickness of 30-150 um is replaced by the art paper with a thickness of 30-120 um.

While the above embodiments and figures as shown do not restrict the configuration and design of the present invention, it is apparent to those skilled in the art that further embodiments and modifications may be made without departing from the scope of the present invention.

What is claimed is:

1. A high-frequency fragile RFID electronic tag with anti-transfer function comprising a bearing substrate, a first adhesive layer, a resin film, an etching antenna layer, a first insulating layer, a conductive circuit layer, a chip, a second adhesive layer, and a pattern-bearing layer, said resin film being disposed between said bearing substrate and said etching antenna layer, said first adhesive layer being disposed between said resin film and said bearing substrate, said etching antenna layer being etched by using copper foil or aluminum foil, said conductive circuit layer and said etching antenna layer being combined to construct a compound high-frequency antenna of said fragile RFID electronic tag, said conductive circuit layer fulfilling a communication of a jumper wire on said etching antenna layer, said first insulating layer being disposed between said conductive circuit layer and said etching antenna layer, said chip being connected to said etching antenna layer, whereby said etching antenna layer, said conductive circuit layer, said first insulating layer, and said chip are combined to construct a core assembly, said pattern-bearing layer being adhered to the other side of said core assembly by using said second adhesive layer.

2. The high-frequency fragile RFID electronic tag with anti-transfer function according to claim 1, wherein said fragile RFID electronic tag includes a second insulating layer disposed between said conductive circuit layer and said second adhesive layer.

3. The high-frequency fragile RFID electronic tag with anti-transfer function according to claim 1, wherein said fragile RFID tag includes a conductive adhesive layer disposed between said chip and said second adhesive layer.

4. The high-frequency fragile RFID electronic tag with anti-transfer function according to claim 1, wherein a material of said pattern-bearing layer is fragile papers, art papers, or PET films, and an outer surface of said pattern-bearing layer is silk-screen printed by an ink layer functioning as an anti-counterfeiting mark.

5. The high-frequency fragile RFID electronic tag with anti-transfer function according to claim 1, wherein a tolerance of an etching precision of circuits on said etching antenna layer is ±0.02 mm, and a minimum wire spacing and width thereof is 0.1-0.25 mm.

6. A method of forming a high-frequency fragile RFID electronic tag with anti-transfer function comprising steps of:
   (1) preparing aluminum foil or copper foil for compounding with a bearing substrate by using a resin film, thereby forming a compound substrate;
   (2) forming a photosensitive compound material or silk-screen printing an anti-etching wet film ink on said aluminum foil or said copper foil of said compound substrate;
   (3) forming an antenna pattern required to be etched into a film plate and transferring a circuit pattern of a conducting wire onto said photosensitive compound material or said anti-etching wet film ink by an exposing mode;
   (4) developing, etching, and stripping said compound substrate which is exposed and adhered with said photosensitive compound material or said anti-etching wet film ink, thereby forming an etching antenna layer with a tolerance of an etching precision of ±0.02 mm and a minimum wire spacing and width of 0.1-0.25 mm;
   (5) silk-screen printing a first insulating layer on said etching antenna layer which is already etched, then silk-screen printing a conductive circuit layer on said first insulating layer, and thence silk-screen printing a second insulating layer on said conductive circuit layer;
   (6) combining said etching antenna layer and a chip to form a core assembly; and
   (7) preparing a pattern-bearing layer, forming an anti-counterfeiting mark layer on one surface of said pattern-bearing layer, coating a second adhesive layer on the other surface thereof, and combining said pattern-bearing layer and said core assembly to obtain said fragile RFID electronic tag.

7. The method according to claim 6, wherein said first insulating layer is an insulating ink with a thickness of 8-30 um, said conductive circuit layer is a conductive silver paste or a conductive ink with a thickness of 5-50 um, and said second insulating layer is an insulating ink with a thickness of 5-30 um.

8. The method according to claim 6, wherein said photosensitive compound material is formed on said aluminum foil or said copper foil by roll-to-roll laminating in said step, and said exposing mode in said step is conducted by a roll-to-roll exposure.

9. The method according to claim 6, wherein said resin film is an adhesive film which prevents being softened under a secondary heating temperature at 30-200° C., thereby preventing being completely removed.

10. The method according to claim 6, wherein a step of arranging a conductive adhesive layer on said chip is performed between said step and said step.

\* \* \* \* \*